United States Patent
Spence

(10) Patent No.: US 6,291,113 B1
(45) Date of Patent: Sep. 18, 2001

(54) SIDELOBE SUPPRESSING PHASE SHIFT MASK AND METHOD

(75) Inventor: Christopher F. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/422,602

(22) Filed: Oct. 21, 1999

(51) Int. Cl.$^7$ .............................. G03F 9/00; G06F 17/50
(52) U.S. Cl. .................................. 430/5; 716/19; 716/21
(58) Field of Search .......................... 430/5, 322; 716/19, 716/21; 395/500.2, 500.21

(56) References Cited

U.S. PATENT DOCUMENTS

| | | | |
|---|---|---|---|
| 5,415,953 | 5/1995 | Alpay et al. | 430/5 |
| 5,487,963 | 1/1996 | Sugawara | 430/5 |
| 5,591,550 | 1/1997 | Choi et al. | 430/5 |
| 5,682,323 | * 10/1997 | Pasch et al. | 716/19 |
| 5,795,682 | 8/1998 | Garza | 430/5 |
| 5,900,338 | 5/1999 | Garza et al. | 430/5 |
| 6,171,731 | * 1/2001 | Medvedeva et al. | 430/5 |

OTHER PUBLICATIONS

Optical Proximity Correction on Attenuated Phase Shifting Photo Mask for Dense Contact Array, Yong K. Choi et al., Advanced Process Technology Department, LG Semicon Co., SPIE vol. 2440, 2/95.

Effect of pattern density for contact windows in an attenuated phase shift mask, Ik–Boum Hur, et al., Hyundai Electronics Co., Ltd. Semiconductor R&D Lab 1, SPIE vol. 2440, 2/95.

The Attenuated Phase–Shifting Mask, Burn J. Lin, IBM General Technology Division, Solid State Technology, Jan. 1992.

* cited by examiner

Primary Examiner—S. Rosasco
(74) Attorney, Agent, or Firm—Renner, Otto, Boisselle & Sklar, LLP

(57) ABSTRACT

A phase shift mask and a method of designing a phase shift mask involves simulation of light exposure through the mask layout in order to identify sidelobe regions. The method includes modification of the mask layout to remove the sidelobe regions. The method of modification may be based upon the size and/or the maximum of light intensity in a given sidelobe region. The method may utilize an iterative process of modifying the mask layout and simulating exposure through the modified mask layout until a threshold criterion such as the non-existence of sidelobe regions is met.

32 Claims, 3 Drawing Sheets

SIDELOBE SUPPRESSING PHASE SHIFT MASK AND METHOD

FIELD OF THE INVENTION

The invention involves photolithography techniques in general, and in particular to improved methods and apparatuses for suppressing sidelobes in phase shift masks.

BACKGROUND OF THE INVENTION

Optical lithography has advanced in recent years in its ability to produce very small features. The most important recent advance in lithography was the introduction of a photomask structure called a phase shift mask. Phase shift masks enable compensation for the diffraction effects which otherwise limit the size of the smallest feature which could be imaged using optical lithography.

Optical lithography refers generally to the technology which enables etching patterns on a substrate through use of photographic development of images which have been attached onto the surface of the substrate using a mask. Generally, the process involves directing light (such as ultraviolet light) through a photomask to expose a light-sensitive film previously deposited on the substrate. If the lightsensitive film is a so-called positive resist and the resist is located beneath a clear area in the photomask, the resist undergoes a physical and chemical change that renders it soluble in a development solution. This process results in the transfer of an image from the photomask to the resist film. Finally, application of an acid to the surface will transfer the resist image into the surface of the substrate.

There are several known types of photomasks for use in lithography which employ phase shifting. The underlying concept of a phase shift mask is to introduce canceling interference of impinging light at portions of an image where diffraction effects have deteriorated the resolution of the image. This is accomplished by providing a mask with appropriately placed and appropriately selected thicknesses of optically transmissive materials so that the ultraviolet light waves which pass through the mask and then image on the target exhibit constructive phase addition at areas in which high intensity for imaging is desirable, and destructive phase subtraction where low intensity is desired. Constructive and destructive phase is explained by considering light as a wave motion so that the effect of a number of wave trains arriving at a point depends on the phase as well as on the amplitude of each of the arriving waves. If light from the same point source starts in phase and travels different paths through different materials to come together at a point, if the waves arrive in phase, they will reinforce each other, i.e., constructive interference. If light from more than one source arrives at the same point, if the various source emissions are coherent, i.e., same polarization, frequency and phase, then their waves can also combine constructively or destructively at the image. Accordingly, for phase shift masks to be effective, it is required that the light source emits light which is at least partially coherent.

A most significant application of phase shift masks (PSMs) in optical lithography is in the formation of electrical circuits on semiconductor materials in the manufacturing of integrated circuits such as semiconductor memory devices, microprocessors and other circuits. Other applications include the manufacture of compact discs and other laser readable memory devices. In the manufacture of integrated circuits, the apparatus most frequently employed to cooperate with the phase shift mask to image the phase shift mask onto the semiconductor substrate is called an optical stepper. The optical stepper positions and holds a wafer and photomasks provide the partially coherent ultraviolet light to image the various photomasks onto the wafer. Generally, the optical system, including the mask, is stationary and an image of a device is formed on a substrate positioned at the focal plane. Normally, the optical stepper is capable of moving the substrate horizontally, i.e., in steps, and permits the same optical exposure imaging process for the adjoining devices. The most common commercial steppers are called "I-line Steppers" where "I" designates that the wavelength of the ultraviolet source lamp being used, i.e., $\lambda=365$ nm. A more advanced stepper employs a deep-uv source where $\lambda=250$ nm.

Exemplary PSMs use phase shift materials which transmit about 8% of the energy incident on the mask. This level of background illumination does not usually lead to undesirable levels of resist loss in the exposed wafer. However, if certain geometries, such as dense contact arrays, or L- or T-shaped patterns are found on the mask, then the intensity at the wafer may increase locally for example to 30% of clear-field exposure. Such a high level of illumination may lead to resist loss, causing the printing of sidelobes.

Referring to FIG. 1, a prior art illumination system 10 includes a mask 12 used to selectively illuminate portions of a wafer 14 covered with a photoresist material 16. The mask 12 includes a light transmissive substrate 20, with a partially-transmissive phase-shifting material 22 on portions of the substrate 20. The phase-shifting material is a material which absorbs most of the light passing therethrough, and shifts the phase of the light which it does allow to pass therethrough. Light passing through the phase-shifting material in phase-shifting regions 24 is preferably shifted in phase by approximately 180 degrees, thereby making it opposite in phase in comparison with light that passes through portions of the mask 12 which do not have a coating of phase-shifting material 22, such as the light transmissive or open region 26 shown in FIG. 1. Light 28 passes through the mask 12 and exposes the resist 16 on the wafer 14.

The transmissivity of the mask 12 is plotted in FIG. 2, wherein the transmissivity of the open region 26 is represented as a positive value 30 and the transmissivity of the regions 24 with phase-shifting material 22 is represented as a negative value 32. The negative value for the transmissivity in regions of the mask 12 covered by the phase-shifting material 22 indicates the interference between light passing through open region 26 and light passing through phase-shifting regions 24.

The electric field intensity from the light 28 reaching the resist 16 is illustrated in FIG. 3, the electric field intensity from the open region 26 being shown by a curve 36, and the electric field intensity from the phase-shifting regions 24 being shown by a curve 38. The open region curve 36 is generally positive, with sinusoidal end portions 40 away from the open region 26, the end portions having asymptotically-reducing amplitude. The phase-shifting region curve 38 has a negative electric field intensity, the negative value being constant far from the open region 26, and reducing to zero in the vicinity of the transition between the phase-shifting regions 24 and the open region 26.

The curves 36 and 38 are summed and squared to give the light exposure in the resist 16, as illustrated in FIG. 4. The light exposure profile has a main peak 42 corresponding to the center of the open region 26. The light intensity drops off from the main peak to main troughs 44 on either side of the main peak 42. Moving further away from the main peak 42 are secondary peaks 46 and tertiary peaks 48. Far away from the main peak 42 is a constant exposure 50 which corresponds to the electric field intensity through phase-shifting regions far away from an open region. A printing threshold intensity level, shown in FIG. 4 as dashed line 54, is the minimum intensity level required for sufficient exposure of the resist 16 to eventually result in printing on the wafer 14. As illustrated, the intensity level results in printing a feature having a width 56 which is less than the width of the open region 26.

It will be appreciated that the threshold 52 must be higher than the level of the secondary peaks 46 in order to avoid printing on the wafer due to the secondary peaks 46. However, a secondary peak may combine with a secondary or tertiary peak from another feature to locally exceed the printing threshold. These undesired areas where the intensity exceeds the threshold are referred to as "sidelobes," "additive sidelobes," or "proximity effects."

It has been proposed to use simple geometric rules to place extra features on the mask to suppress sidelobes. However, these rules are arbitrary and will be incomplete and may be inadequate to prevent sidelobes in all cases.

Further, the use of geometric rules may result in more extra features than are necessary to suppress side lobes.

SUMMARY OF THE INVENTION

A phase shift mask and a method of designing a phase shift mask involves simulation of light exposure through a virtual mask layout in order to identify sidelobe regions. The method includes modification of the virtual mask layout to remove the sidelobe regions. The method of modification may be based upon the size and/or the maximum of light intensity in a given sidelobe region. The method may utilize an iterative process of modifying the mask layout and simulating exposure through the modified mask layout until a threshold criterion such as the non-existence of sidelobe regions is met.

According to an aspect of the invention, a method for designing a phase shift mask includes simulating light exposure through an initial mask layout. The simulating may involve use of an aerial simulation program.

According to another aspect of the invention, a method for designing a phase shift mask includes modifying an initial mask layout to suppress sidelobes. The modifying may include selecting a method of modification based on the size of and/or the light intensity in the sidelobe to be suppressed.

According to yet another aspect of the invention, a phase shift mask includes sidelobe suppressing features of a type and size based on the size of and/or the light intensity in the sidelobe to be suppressed.

According to still another aspect of the invention, a method for designing a phase shift mask for illuminating a circuit design pattern on a resist-covered wafer includes 1) defining a virtual mask layout of transmissive regions and partially-transmissive phase-shifting regions, the transmissive regions corresponding to regions on the wafer to be exposed; 2) simulating light exposure of the wafer through the mask layout to identify sidelobe regions; and 3) modifying the mask layout to reduce light exposure in the sidelobe regions.

According to a further aspect of the invention, a phase shift mask for exposing a resist-covered wafer includes transmissive regions corresponding to regions on the wafer to be exposed; phase-shifting regions on the phase shift mask; and sidelobe suppressing regions for suppressing sidelobes predicted by simulating light exposure of the wafer through a corresponding virtual phase shift mask.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
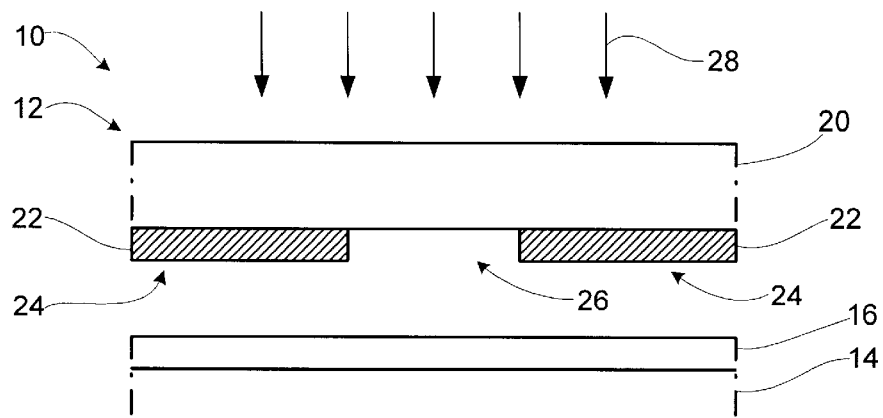
FIG. 1 is a schematic illustration of a prior art illumination system.
Figure 2:
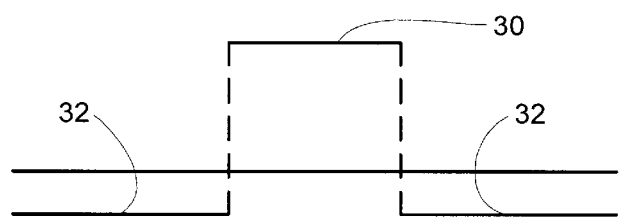
FIG. 2 is a graph of the transmissivity of the mask of the system of FIG. 1.
Figure 3:
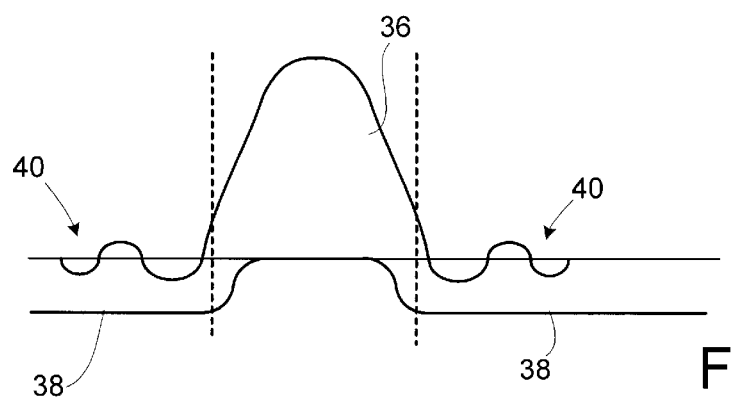
FIG. 3 is a graph of the electric field intensity for light passing through the mask of the system of FIG. 1.
Figure 4:
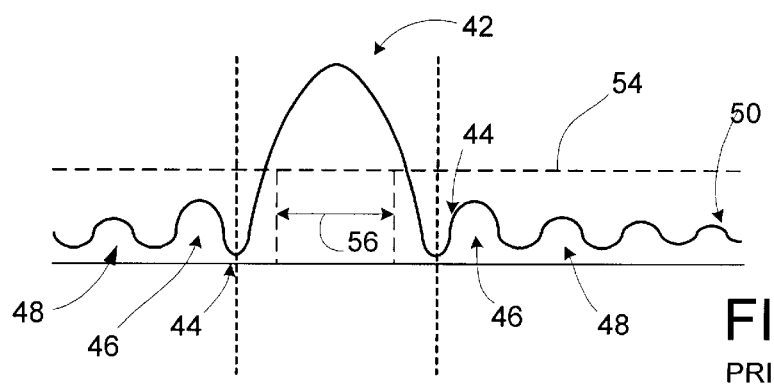
FIG. 4 is a graph illustrating the resist exposure of the system of FIG. 1.
Figure 5:
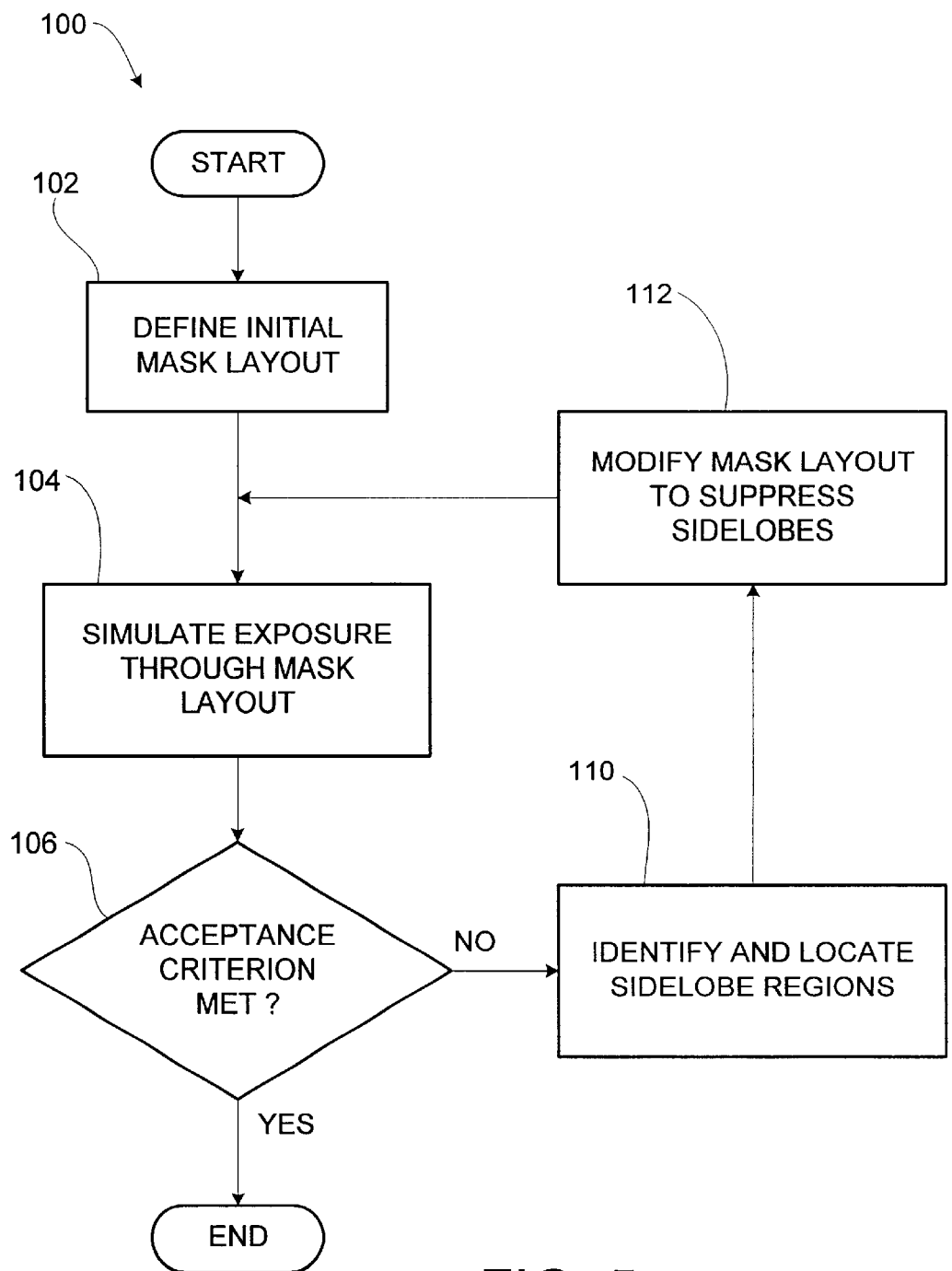
FIG. 5 is a flow chart illustrating a method for designing a phase shift mask in accordance with the present invention.

FIG. 5 is a flow chart of a method 100 for reducing or illuminating the effects of sidelobes in a phase-shifting mask. In step 102, an initial virtual mask layout is defined. The initial layout includes transmissive or open regions and partially-transmissive phase-shifting regions. The transmissive regions may be sized and shaped in order to correspond to the desired size and shape of the printing on the wafer. It will be appreciated that such sizing may take into account the expected differences in size and shape between open regions of the mask and printed regions on the wafer, such as the difference between the width of the open region 26 and the width 56 which was described above in reference to FIGS. 1 and 4. It will further be appreciated that this difference may be a function of the geometry of the illumination system, and more particularly of the positional relationship between a light source, the mask, and the wafer.

It will also be appreciated that the initial mask layout may include regions having different partial transmissivities, as well as regions that are neither open nor partially transmissive, such as opaque regions.

Following the definition of the initial mask layout, in step 104 simulation is made of the exposure through the mask layout. The simulation may include using aerial simulation modeling of the exposure of the wafer. Suitable computer programs for performing aerial image simulation include the SPLAT program available from the University of California at Berkeley.

The simulation may involve simulating exposure of the wafer or a portion thereof corresponding to the entire mask. Alternatively, the simulation may involve simulating exposure of the resist in regions where sidelobe formation is likely to occur.

Such an area may be bounded by the trough regions associated with transitions between open regions and phase-shifting partially-transmissive regions. By limiting the simulation to only a portion of the wafer, it will be appreciated that time and computational resources for running computer simulations may thereby be reduced. To further reduce the computation power needed for the simulation, the simulation may be limited to areas which are particularly prone to formation of sidelobes, for example, corners and regions between closely-spaced features. Alternatively or in addition, the simulation may be limited to areas that are within a certain distance of a boundary of a feature.

The simulation may involve a relatively simple simulation of the light exposure through the mask. Alternatively, the simulation may be made more complex, such as by adding models of the kinematics of the resist, effects of thickness of the resist layer on exposure, depth of focus effects of the system, and/or other features of resist exposure models.

The results of the simulated exposure are analyzed in step 106 to determine if an acceptance criterion is met. An example of an acceptance criterion may be that there are no sidelobe regions (regions outside of the desired print areas with light intensities greater than the threshold value). If the acceptance criterion is met, the initial mask layout is acceptable and the program ends. However, if the acceptance criterion is not met, the method 100 includes a step 110 identifying and locating sidelobe regions, and a step 112 for modifying the mask layout to suppress or remove the sidelobes.

Preferably, the modification of the mask layout is tailored to the individual characteristics of the sidelobe to be removed. A variety of methods may be used to modify the virtual layout to remove the sidelobes. For example, all or portions of transmissive areas of the mask corresponding to the sidelobes may be transformed into open, light-transmissive areas. Alternatively, such areas may be transformed into less-transmissive or opaque areas. The transmissivity of the partially-transmissive phase-shifting regions may be changed locally or globally, and/or the boundaries of the open regions may be moved. Other ways of removing the sidelobes will be appreciated by one skilled in the art. In addition, the remedy for removing a sidelobe may include more than one of the above ways.

The method of modifying the layout to remove sidelobes may be selected based on the size of the sidelobe and/or the level of highest light intensity in the sidelobe. For example, small, relatively low intensity sidelobe regions may be removed by placing an open region on the corresponding region of the mask layout, while high intensity, large sidelobe regions may be remedied by modifying the layout to include a relatively large open region with an opaque region at its center. Such modifications are described in greater detail below.

Preferably the modified mask layout is subjected to a re-simulation similar to the simulation in step 104, to confirm that the modifications have removed the sidelobe regions, that no new sidelobe regions have been caused as a result of the modifications, and/or to check whether the modifications have affected the printed pattern on the wafer. The simulation and modification steps may be performed iteratively until some acceptance criterion such as a lack of sidelobe regions, is satisfied.

Figure 6:
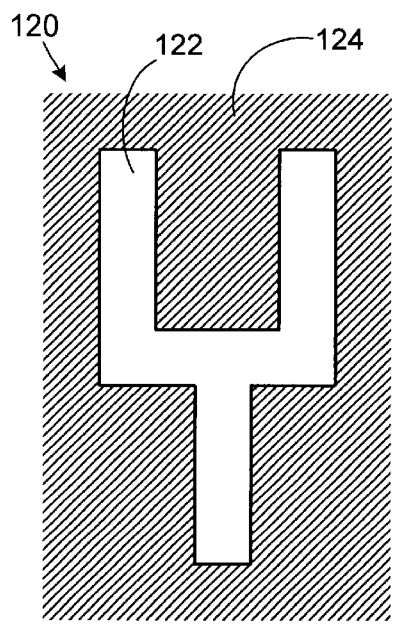
FIG. 6 is a fragmentary plan view of a portion of an initial mask layout used in performing a method for designing a mask in accordance with the present invention.
Figure 8:
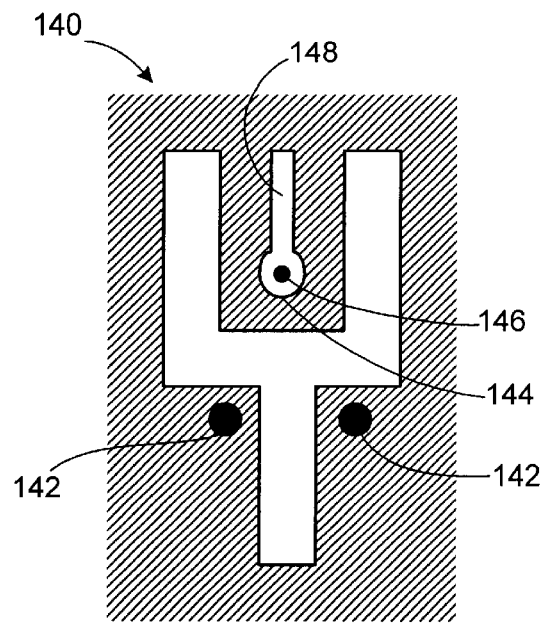
FIG. 8 is an illustration of a modified mask to remove sidelobe regions shown in the simulation of FIG. 7.
Figure 7:
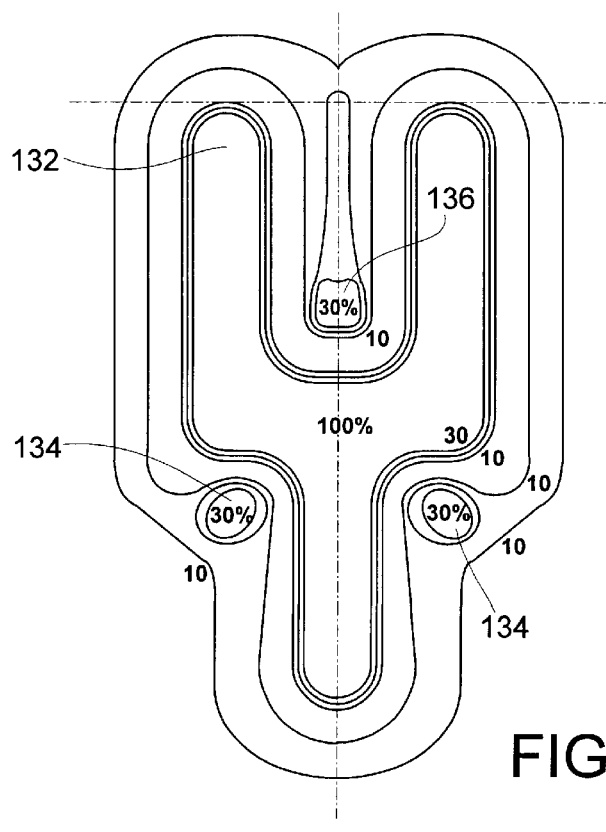
FIG. 7 is an illustration of the results of an exposure simulation using the initial mask layout of FIG. 6.

FIGS. 6–8 conceptually illustrate an exemplary performance of the above-identified method. FIG. 6 shows a portion of an initial mask layout 120, the mask layout 120 having an open region 122 for printing a desired feature on the wafer, and a partially-transmissive phase-shifting region 124 around the open region 122. The phase-shifting corresponds to an area on the wafer where no feature is to be printed.

FIG. 7 illustrates the results of a simulation using the initial mask layout 120 of FIG. 6. Lines of constant light intensity are shown in FIG. 7 using an arbitrary scale. A central region 132 is the desired printed region. Corner sidelobe regions 134 occur near corners of the feature to be printed. In addition, a central sidelobe region 136 occurs between the closely-spaced parallel lines of the feature to be printed. The central sidelobe region 136 is larger, has a different shape, and has a higher intensity than the corner sidelobe regions 134.

FIG. 8 schematically illustrates a possible modified mask layout 140 for removing the sidelobes 134 and 136. The corner sidelobes are removed by placing regions 142 of opaque material on the layout 140. Suitable opaque materials are well known in the art, chrome being an example of such a suitable opaque material.

The larger central sidelobe region 136 is removed by modifying the mask to include a circular open region 144 enclosing an opaque central region 146. A rectangular open slit region 148 is connected to the open region 144 for removing the remainder of the central sidelobe region 136.

It will be understood that the modifications shown in FIG. 8 are merely exemplary, and that other modifications to remove the sidelobes may be possible.

It will be appreciated that the above-described method for identifying and removing sidelobe regions may more effectively and less intrusively remove sidelobe regions when compared with previous attempts to overcome the problems of sidelobes in phase shift masks. Rather than adhering to geographical rules for placement of opaque materials or additional open regions, the present method tailors the size and/or the type of modifications of the phase shift mask to the size and/or the intensity of the sidelobe regions predicted from the simulations.

Although the method has been described above as using computer-based simulations, it will be appreciated that other types of simulations may be employed.

By limiting the modifications to the phase shift mask, it will be appreciated that a mask produced by the above-described method will retain more of the benefits that motivated use of phase shift masks in the first place.

It will be appreciated that the above-described method may be used to test the feasibility of varying many parameters of phase shift mask design. For example, the effect of varying the transmissivity of partially-transmissive regions may be examined. In addition, a comparison of the effects of different sidelobe removing rules on a layout may be examined.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for designing a phase shift mask for illuminating a circuit design pattern on a resist-covered wafer, the method comprising:
   defining a virtual mask layout of transmissive regions and partially-transmissive phase-shifting regions, the transmissive regions corresponding to regions on the wafer to be exposed;
   simulating light exposure of the wafer through the mask layout to identify sidelobe regions; and
   modifying the mask layout to reduce light exposure in the sidelobe regions.

2. The method of claim 1, wherein the simulating includes aerial simulation modeling of the exposure of the wafer.

3. The method of claim 2, wherein the simulating includes simulating light exposure through substantially all of the mask layout.

4. The method of claim 2, wherein the simulating includes simulating light exposure of the wafer only in a region bounded by main troughs.

5. The method of claim 1, wherein the modifying includes making transmissive portions of the partially-transmissive phase-shifting regions corresponding to at least some of the sidelobe regions.

6. The method of claim 1, wherein the modifying includes making less transmissive portions of the partially-transmissive phase-shifting regions corresponding to at least some of the sidelobe regions.

7. The method of claim 1, wherein the modifying includes making opaque portions of the partially-transmissive phase-shifting regions corresponding to at least some of the sidelobe regions.

8. The method of claim 1, wherein the modifying includes choosing a method of modifying based on levels of simulated light exposure in respective of the sidelobe regions.

9. The method of claim 1, further comprising iteratively re-simulating light exposure of the wafer through the modified mask layout and re-modifying the modified mask layout, until an acceptance criterion is met.

10. A phase shift mask for exposing a resist-covered wafer, comprising:
    transmissive regions corresponding to regions on the wafer to be exposed;
    phase-shifting regions on the phase shift mask; and
    sidelobe suppressing regions for suppressing sidelobes predicted by simulating light exposure of the wafer through a corresponding virtual phase shift mask.

11. The mask of claim 10, wherein sizes of the sidelobe suppressing regions are a function of the size of the predicted sidelobes.

12. The mask of claim 10, wherein transmissibility of the sidelobe suppressing regions is a function of predicted light exposure of the predicted sidelobes.

13. The mask of claim 10, wherein the sidelobe suppressing regions include opaque regions and light transmissive regions.

14. A method for designing a phase shift mask for illuminating a circuit design pattern on a resist-covered wafer, the method comprising:
    defining a virtual mask layout of transmissive regions and partially-transmissive phase-shifting regions, the transmissive regions corresponding to regions on the wafer to be exposed;
    simulating light exposure of the wafer through the mask layout to identify sidelobe regions, wherein the simulating includes aerial simulation modeling of the exposure of the wafer;
    modifying the mask layout to reduce light exposure in the sidelobe regions; and
    iteratively re-simulating light exposure of the wafer through the modified mask layout and re-modifying the modified mask layout, until an acceptance criterion is met.

15. The method of claim 14, wherein the simulating includes simulating light exposure through substantially all of the mask layout.

16. The method of claim 14, wherein the simulating includes simulating light exposure of the wafer only in a region bounded by main troughs.

17. The method of claim 14, wherein the modifying includes making transmissive portions of the partially-transmissive phase-shifting regions corresponding to at least some of the sidelobe regions.

18. The method of claim 14, wherein the modifying includes making less transmissive portions of the partially-transmissive phase-shifting regions corresponding to at least some of the sidelobe regions.

19. The method of claim 14, wherein the modifying includes making opaque portions of the partially-transmissive phase-shifting regions corresponding to at least some of the sidelobe regions.

20. The method of claim 14, wherein the modifying includes choosing a method of modifying based on levels of simulated light exposure in respective of the sidelobe regions.

21. The method of claim 1, wherein the identifying the sidelobe regions includes identifying regions outside desired print areas, with light intensities greater than a threshold value.

22. The method of claim 1, wherein the simulating includes simulating features of a resist exposure model.

23. The method of claim 22, wherein the simulating the features of the resist exposure model include simulating effect of resist layer thickness.

24. The method of claim 22, wherein the simulating the features of the resist exposure model include simulating depth of focus effects.

25. The method of claim 22, wherein the simulating the features of the resist exposure model include simulating resist kinematics.

26. The method of claim 9, wherein the acceptance criterion includes an absence of the sidelobe regions.

27. The method of claim 14, wherein the identifying the sidelobe regions includes identifying regions outside desired print areas, with light intensities greater than a threshold value.

28. The method of claim 14, wherein the simulating includes simulating features of a resist exposure model.

29. The method of claim 28, wherein the simulating the features of the resist exposure model include simulating effect of resist layer thickness.

30. The method of claim 28, wherein the simulating the features of the resist exposure model include simulating depth of focus effects.

31. The method of claim 28, wherein the simulating the features of the resist exposure model include simulating resist kinematics.

32. The method of claim 14, wherein the acceptance criterion includes an absence of the sidelobe regions.

* * * * *